(12) United States Patent
Christopherson et al.

(10) Patent No.: US 6,339,047 B1
(45) Date of Patent: Jan. 15, 2002

(54) COMPOSITES HAVING HIGH WETTABILITY

(75) Inventors: Craig J. Christopherson, Worcester; David M. Olen, Holden; Deborah L. Ouellette, Warren; Thomas De Santos, Stoughton; Eric R. Podtburg, Natick; Sy-Jenq Loong, Westborough, all of MA (US)

(73) Assignee: American Semiconductor Corp., Westborough, MA (US)

(*) Notice: Subject to any disclaimer, the term of this patent is extended or adjusted under 35 U.S.C. 154(b) by 0 days.

(21) Appl. No.: 09/488,740

(22) Filed: Jan. 20, 2000

(51) Int. Cl.[7] .............................. B05D 5/12; C23F 1/00; H01L 39/24

(52) U.S. Cl. ....................... 505/410; 505/728; 505/820; 216/3

(58) Field of Search ................................. 505/410, 728, 505/785, 820; 216/3, 7

(56) References Cited

U.S. PATENT DOCUMENTS

| | | | |
|---|---|---|---|
| 4,996,191 A | * | 2/1991 | Kobayashi et al. ............. 505/1 |
| 5,882,536 A | * | 3/1999 | Balachandran et al. ........ 216/43 |
| 5,935,911 A | * | 8/1999 | Yamada et al. .............. 505/230 |
| 5,952,270 A | * | 9/1999 | Hughson et al. ............. 505/433 |
| 6,110,392 A | * | 8/2000 | Kerber et al. ................... 216/3 |

* cited by examiner

Primary Examiner—Mark Kopec
(74) Attorney, Agent, or Firm—Elizabeth E. Nugent; Choate, Hall & Stewart

(57) ABSTRACT

Methods of treating superconducting composites to enhance their wettability in solder, and composites having enhanced wettability. It has been found that wettability can be substantially enhanced by stripping a thin layer off the surface of the composite before incorporating it into a laminated component. This layer can be stripped, for example, by chemically etching the composite, for example in a solution of nitric acid and ammonium bifluoride.

10 Claims, 3 Drawing Sheets

COMPOSITES HAVING HIGH WETTABILITY

FIELD OF THE INVENTION

The present invention is related to methods of enhancing the wettability of composite materials, and in particular to composite materials that may be easily laminated to form components which can withstand thermal cycling.

BACKGROUND OF THE INVENTION

High temperature superconductors (HTS materials) have increasing utility as power conductors, fault current limiters, and other applications. Since HTS materials are generally brittle oxides, it is common to produce them in composite form, wherein superconducting filaments are supported by a noble metal matrix. The matrix is most commonly silver-based, but any metal or alloy which will withstand superconductor processing conditions and which does not act to poison the superconductor may be used.

It has been observed that in use, superconducting composites often exhibit "ballooning." When the composite is immersed in liquid nitrogen or another cryogen suitable for achieving superconducting properties, a certain amount of cryogen collects in interstices between the matrix and the superconducting filaments. When the composite is allowed to return to room temperature, the cryogen expands and causes portions of the composite to deform to form balloons. This deformation subjects the delicate superconducting filaments to fatigue and possibly fracture, degrading or destroying superconductor filaments. A strong need thus exists for a method of preventing ballooning from occurring.

SUMMARY OF THE INVENTION

When a superconducting composite is to be laminated by soldering it to another material (e.g., a metal tape which can provide mechanical and/or thermal stabilization), it is important that the laminate be sealed against any infiltration by liquid cryogen to prevent ballooning, and further that it be in good thermal and mechanical contact with the solder in order to avoid the creation of hot spots or stress concentrations. Similarly, when a composite is protectively encapsulated (e.g., with solder or with a polymer), the encapsulating material should be free of defects that might compromise the integrity of the seal. Also, when forming multistrand cables, solder or another material may be used to hold the strands together, and again, a good contact between the solder and the strands should be achieved.

In one aspect, the invention comprises methods of preparing superconducting composites for lamination, encapsulation, or any other process that requires wetting of the composite by a liquid. The method comprises removing a thin layer of matrix material to expose a surface having a low concentration of oxide particles. The layer may be removed, for example, by chemical etching or by electrolytic cleaning. If it is removed by etching, the etchant may be, for example, nitric acid, hydrochloric acid, ferric chloride, ammonia, a caustic solution, or a mixture of these, and may contain other salts such as ammonium bifluoride. The thin layer may be on the order of 0.013 mm thick, or as thick as can be achieved without excessively degrading the properties of the superconductor (e.g., degrading the critical current by more than about 10%). The exposed surface may subsequently be coated with solder, which may wet the surface with a wettability of at least 250 $\mu$N/mm, 300 $\mu$N/mm, or 350 $\mu$N/mm. The solder may be, for example, lead-tin, silver-tin, silver-lead-tin, or lead-indium solder. When the thin layer is removed electrolytically, an electrolyte such as nitric acid, hydrochloric acid, sulfuric acid, sodium hydroxide, ferric chloride, or ferrous chloride may be used. The removal process may leave the exposed surface at least 97% free of foreign particles, at least 99% free, at least 99.5% free, or at least 99.8% free.

By "noble metal" as it is used herein, it is meant any metal whose reaction products are thermodynamically unstable under the reaction conditions employed relative to the desired superconducting ceramic, or which does not react with the superconducting ceramic or its precursors under the conditions of manufacture of the composite. A noble metal matrix may be a metal different from the metallic elements of the superconducting ceramic, such as silver, gold, or their alloys, or it may be a stoichiometric excess of one of the metallic elements of the superconducting ceramic, such as copper.

By "desired superconducting ceramic" as it is used herein, it is meant the oxide superconductor intended for eventual use in the finished article. Typically, the desired oxide superconductor is selected for its superior electrical properties, such as high critical temperature or critical current density. The desired oxide superconductor is typically a member of a superconducting oxide family which has demonstrated superior electrical properties, for example, BSCCO 2223 (including BSCCO (2.1)223) or BSCCO 2212 in the BSCCO family. By "precursor" is meant any material that can be converted to an oxide superconductor upon application of a suitable heat treatment. Precursors may include any combination of elements, metal salts, oxides, suboxides, oxide superconductors which are intermediate to the desired oxide superconductor, or other compounds which, when reacted in the stability field of a desired oxide superconductor, produces that superconductor. For example, there may be included elements, salts, or oxides of copper, yttrium, and barium for the YBCO family of oxide superconductors; elements or oxides of copper, bismuth, strontium, and calcium, and optionally lead, for the BSCCO family of oxide superconductors; elements, salts, or oxides of copper, thallium, calcium and barium or strontium, and optionally, bismuth and lead, for the thallium (TBSCCO) family of oxide superconductors; elements, salts, or oxides of copper, mercury, calcium, barium or strontium, and optionally, bismuth and lead, for the mercury (HBSCCO) family of oxide superconductors. The YBCO family of oxide superconductors is considered to include all oxide superconductors of the type comprising barium, copper, and a rare earth selected from the group consisting of yttrium, lanthanum, neodymium, samarium, europium, gadolinium, terbium, dysprosium, holmium, erbium, thulium, ytterbium, and lutetium. By "oxide superconductor intermediate to the desired oxide superconductor" is meant any oxide superconductor which is capable of being converted to the desired oxide superconductor. The formation of an intermediate may be desired in order to take advantage of desirable processing properties, for example, a micaceous structure amenable to texturing, which may not be equally possessed by the desired superconducting oxide. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. Thalliation, the addition of doping materials, including but not limited to the optional materials identified above, variations in proportions and such other variations in the precursors of the desired superconducting oxides as are well known in the art, are also within the scope and spirit of the invention.

BRIEF DESCRIPTION OF THE DRAWING

The invention is described with reference to the several figures of the drawing, in which.

DETAILED DESCRIPTION

Figure 1B:
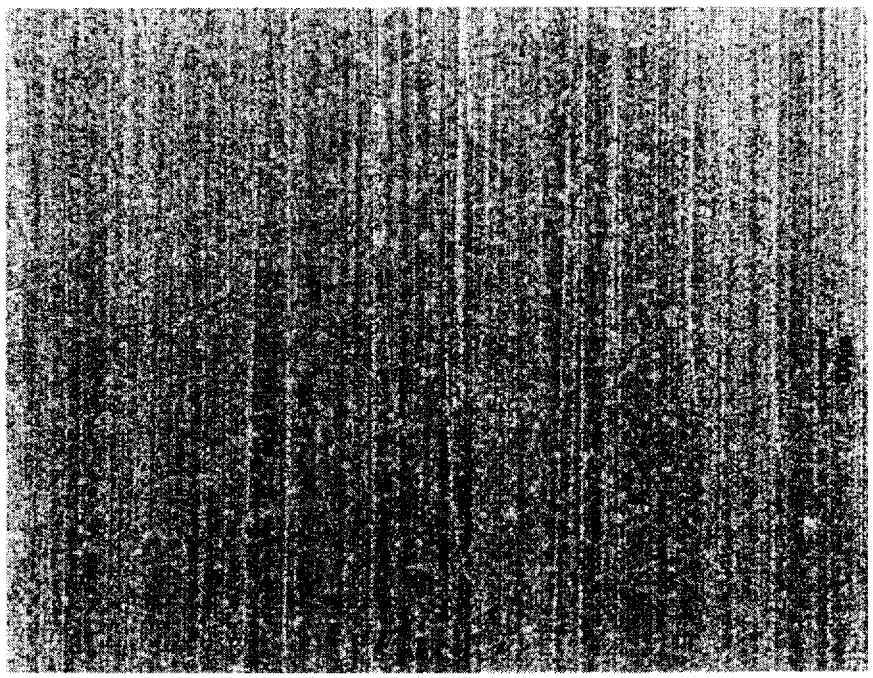
FIGS. 1a and 1b are photomicrographs of a superconducting composite before and after treatments according to the invention.

The present invention provides improved methods of laminating a material to a superconducting composite. These methods allow solder to wet the surface of a metal matrix much more effectively, reducing pinholes in the solder that can allow liquid cryogen to penetrate the composite and cause ballooning.

It has been found that very small tunnels and similar defects can form in solder during a lamination process, which can provide pathways for cryogen to infiltrate the superconducting composite to cause ballooning. These tunnels can also lead to nonuniform heat transfer when the superconducting composite carries a sufficiently high current that resistive heating can occur (as when superconducting composites are used as fault current limiters). In addition, defects can cause stress concentrations that may adversely affect the properties of the composite. The inventors have discovered that these tunnels and other defects may be attributed to oxide particles and/or other defects on the surface of the composite before the solder is applied, and have developed novel techniques for removing these deposits.

Superconducting composites are often formed by first forming a precursor composite, which is then subjected to heat treatment (usually under an oxidizing atmosphere) to produce the desired superconductor composite. The oxide-powder-in-tube (OPIT), metal precursor (MP), and coated conductor (CC) routes of superconductor formation are examples of such processes. The precursor composite is generally converted into the final desired superconducting composite before lamination, to avoid damaging the solder layer or allowing it to poison the oxide superconductor.

It is desirable to wind precursor composite tapes on a mandrel or cassette before heat treating, so that a large quantity of material can be heat treated in a batch process. One problem with this technique is self-sticking, wherein adjacent surfaces of the metal matrix bond to one another during the heat treatment. It can be very difficult to separate the tapes after heat treatment without causing mechanical damage to the composite.

Commonly assigned U.S. Pat. No. 5,952,270 to Hughson, et al., and copending and commonly assigned U.S. patent application Ser. No. 09/309,220, filed May 10, 1999 (both of which are incorporated herein by reference) describe a system for preventing mechanical damage heat treating precursor composites, by applying a separating agent to the tape surface before heat treating. This separating agent may be, for example, a porous coating or a powder (e.g., $Zr_2O_3$ or MgO powder) which separates the adjacent metal layers to prevent sticking. While the separating agent is preferably a material which is relatively easy to remove from the composite surface after heat treating, small quantities of the agent often remain even after determined efforts to remove them. For example, even after cleaning with a regimen of air jets, vacuum treatments, mechanical abrasion, and ultrasonic cleaning, some particles of MgO powder have been observed to remain on the surface of the material.

In addition, oxide and other particles may form on the surface of the composite during heat treatment. A very common matrix material is silver (or silver alloys). Even high-purity silver usually contains some amount of "tramp" copper as an impurity. It has been observed that in the high temperatures and oxidating conditions used to convert precursor composites into superconducting composites, this copper may segregate to the surface to form copper oxide. In addition, silver is vulnerable to trace amounts of sulfur in the air, forming silver sulfide particles (tarnish) on its surface.

Copending and commonly assigned U.S. patent application Ser. No. 09/240,998, filed Feb. 1, 1999 and PCT publication WO99/40633 (both of which are incorporated herein by reference) disclose methods of alloying a noble metal matrix such as silver with other elements such as gallium, tin, antimony, or other suitable materials by a diffusion process. This diffusion process may also leave behind some amount of an oxide of the alloying element on the surface of the composite.

Any of these foreign particles may be further embedded into the surface by subsequent rolling operations, rendering them even more difficult to remove without damaging the superconductor. Further, it has not previously been recognized that any need existed to remove more of the particles than can be removed by conventional methods such as water or air knives, ultrasonic cleaning, mechanical scrubbing, and the like. The present invention comprehends the discovery that even a small concentration of these particles may serve as a source of "pinhole" faults in a solder layer when such a composite is laminated.

Figure 1A:
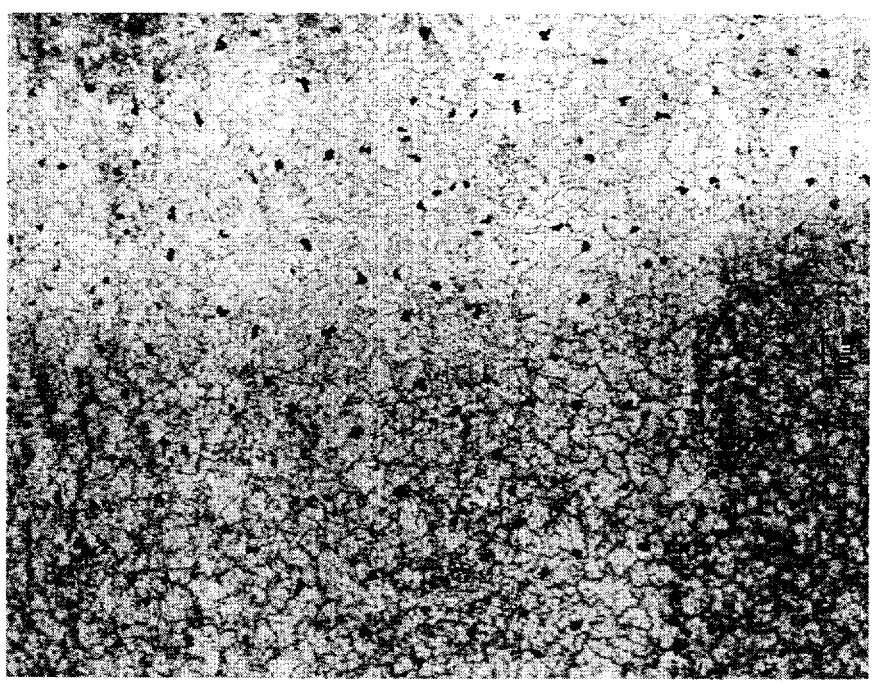

FIG. 1a is a photomicrograph of the surface of a composite of BSCCO filaments in a silver matrix, which has been heat treated and cleaned by conventional methods. Despite cleaning procedures significantly more stringent than those normally suggested to prepare a surface for soldering, a number of foreign particles remain. The large dark particles in the figure have been found to comprise primarily copper oxide, while the uneven "haze" of lighter gray material is mostly fine MgO particles. It is estimated that the total coverage of the surface by particles is on the order of 3–5%. According to the invention, a substantial portion of these particles are removed by removing a thin surface layer from the matrix.

In one preferred embodiment, the oxide particles are stripped from the surface by etching away a thin layer of the surface. An example of the results of this process can be seen in FIG. 1b. This photomicrograph shows the composite of FIG. 1a after a chemical treatment according to the invention. In this case, the composite was held in a 50/50 mixture of nitric acid and water containing 90 g/l of ammonium bifluoride. The etching solution was heated to 48° C. and the matrix was held in the solution for a period of 5 sec, etching the silver matrix to a depth of about 0.013 mm (0.0005"). A comparison of FIG. 1a and FIG. 1b will show that a very large proportion of the foreign particles have been removed by this chemical treatment.

The particular matrix material and etching parameters used in the sample of FIGS. 1a and 1b are exemplary only; other chemical treatments which provide similar etching of the metal matrix may also be used. Alternatively, other methods of removing a thin layer of matrix material, such as electrolytic cleaning, may also be used. It is recommended that etching be to a depth of at least half of the typical particle diameter of the surface particles, and etching may be as deep as desired without damaging a large fraction of the superconducting filaments. Some damage to surface filaments is acceptable, as long as it does not cause an unacceptable degradation in the desired properties of the superconducting composites (e.g., a degradation of more than 10% in the total critical current).

Once the matrix has been etched to remove these particles, the inventors have discovered the surprising result that the wettability of the matrix (e.g., by solder) is remarkably enhanced. Without wishing to be bound by any particular explanation of this phenomenon, it is believed that this enhanced wettability is due to removal of the foreign particles. Despite the fact that the concentration of particles on the surface before treatment is relatively small (well within normal guidelines for a surface "clean" enough to solder), they appear to have a significant effect upon wettability of the matrix. This conclusion is supported by the determination that pure silver has a wettability similar to that of the treated samples (see FIGS. 2 and 3).

Figure 2:
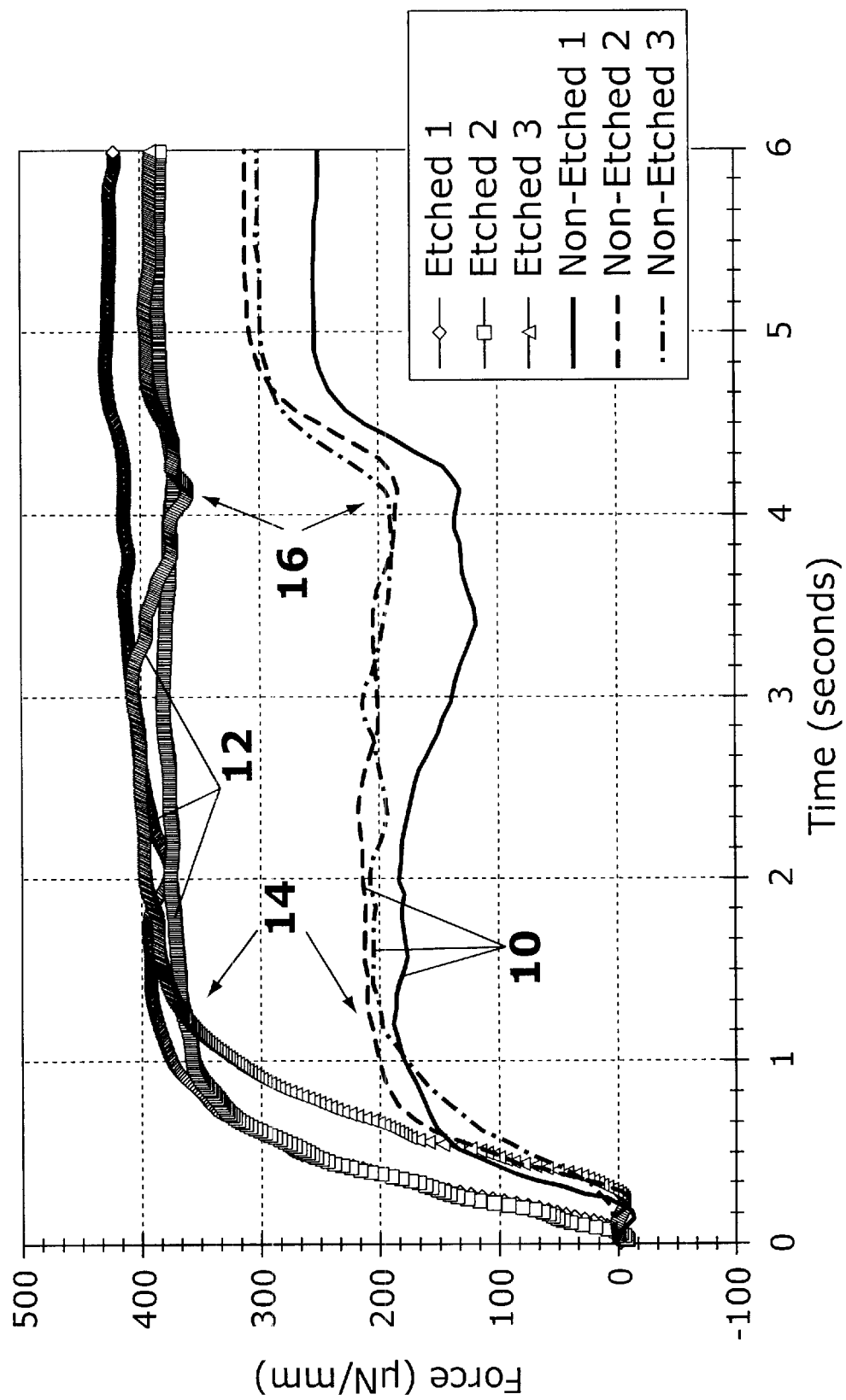
FIG. 2 plots wetting balance of superconducting composites before and after treatments according to the invention.

FIG. 2 plots measurements of the wetting of matrix material which has been treated according to the invention. These plots were generated by measuring the force on a strip of composite material as it was dipped into a pot of molten solder, according to MIL-STD-883/TM2022 (incorporated herein by reference). Lines 10 show force (in $\mu$N/mm) vs. time (in seconds) for untreated specimens, while lines 12 show similar measurements for specimens treated according to the invention.

For the untreated specimens, it can be seen that there was a small force resisting insertion of the specimen into the solder, until the surface tension of the molten solder was broken. A capillary action acting to pull the specimen further into the pot then built up as the specimen was inserted farther into the solder. At point 14, the specimen was held stationary in the solder. During the time that the specimen was held in the solder (between points 14 and 16), the force wavered considerably, indicating some instability in the wetting behavior, but eventually, at point 16, stabilized at an equlibrium value. (Without wishing to be bound to this explanation, it is believed that this wavering is due to dewetting of the oxide particles on the surface of the material).

The untreated specimens have been found to exhibit small solder tunnels and consequent ballooning, despite the fact that they pass many conventional solderability tests, including the MIL-STD-883/TM2022 and DeVore's Solderability Index (both of which are discussed in Russell, et al., "Component Solderability Guide," Electronic Industries Association, incorporated herein by reference).

In contrast, the specimens treated according to the invention exhibited significantly different behavior. There was essentially no initial resistance to insertion of the specimens into the solder at the start of the test, and the capillary force built up to a much higher level, indicating that the surface of the specimens was much more readily wetted by the solder. In addition, the instability was much reduced for two of the three treated specimens.

Figure 3:
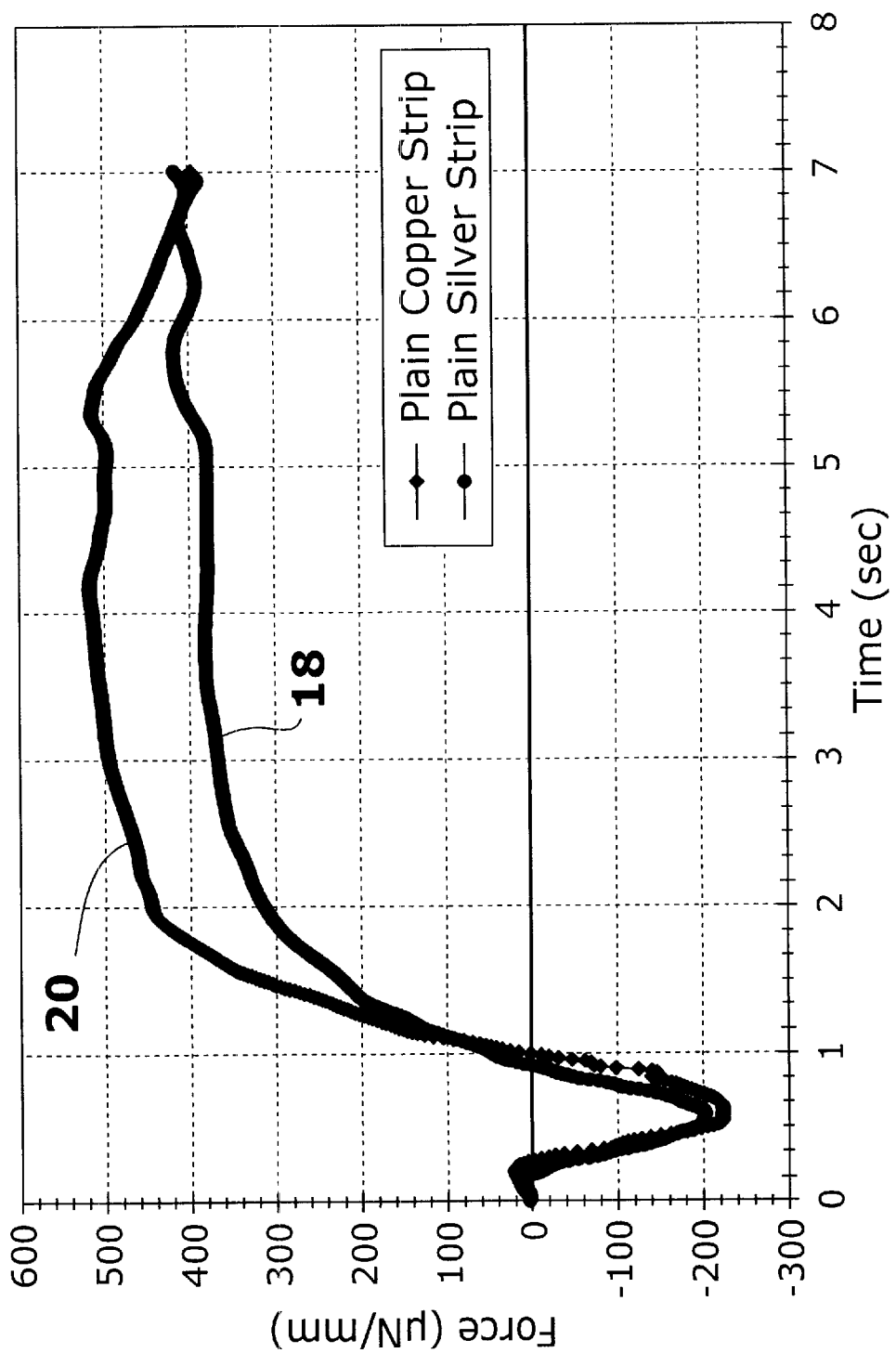
FIG. 3 plots wetting balance of pure silver and pure copper.

The wettability data for the treated and untreated composites were compared with wettability data for pure silver 18 and for pure copper 20, as shown in FIG. 3. While the copper and silver specimens required a greater force to break the initial surface tension of the liquid solder, because of their larger cross-sectional area, the wetting curve for pure silver is very similar to that of the treated specimens, lending support to the idea that the treatment works by exposing an uncontaminated silver (or alloy) surface.

In another example of the techniques of the invention, about 10–13 weight % Ga (with respect to Ag content) was deposited on the surface of a superconducting tape comprising BSCCO filaments in a silver sheath, using electroplating techniques and a reel to reel electroplating line. After plating, the Ga was diffused into the sheath, making a high resistance Ag-Ga solid solution alloy. After the diffflusion process, a gallium oxide skin was present on the surface of the tape. This oxide layer was chemically removed prior to subsequent lamination processing, using a 50% nitric acid solution containing 90 g/l of ammonium bifluoride. The etching solution was heated to 48° C. and the diffused tape was run through the solution (maintaining a 5 sec residence time) using a reel to reel etching line. Once the tape was chemically stripped of its gallium oxide layer, it was readily soldered during the lamination process.

The lamination process was used to provide both mechanical and thermal stabilization for the strand. Using reel to reel processing machinery and a wave solder pot, the gallium post processed wire was bonded to a stainless steel stabilizer using a 50/50 lead-indium solder.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of preparing a surface on a superconducting composite comprising superconducting filaments embedded in a silver-containing matrix prior to coating with a liquid, comprising:

removing a thin layer of the silver-containing matrix material to expose a surface having a reduced concentration of nonsuperconducting oxide particles, by chemical etching with a solution comprising nitric acid and an effective amount of ammonium bifluoride.

2. The method of claim 1, wherein removing a thin layer comprises removing a layer of at least 0.013 mm.

3. The method of claim 1, wherein removing a thin layer does not degrade the critical current of the superconducting composite by more than 10%.

4. The method of claim 1, wherein etching comprises holding the material for an effective period of time in a solution further comprising a chemical selected from the group consisting of hydrochloric acid, ferric chloride, ammonia, caustic solutions, and mixtures of the above.

5. A method of preparing a surface on a superconducting composite comprising superconducting filaments embedded in a matrix prior to coating with a liquid, comprising:

removing a thin layer of the matrix material to expose a surface having a reduced concentration of non-superconducting oxide particles, wherein removing a thin layer comprises electrolytic cleaning of the matrix.

6. The method of claim 5, wherein the cleaning is accomplished by immersing the superconducting composite into an electrolyte comprising a material selected from the group consisting of nitric acid, hydrochloric acid, sulfuric acid, sodium hydroxide, ferric chloride, and ferrous chloride.

7. The method of claim 1 or 5, wherein the exposed surface is 97% free of nonsuperconducting oxide particles.

8. The method of claim 1 or 5, wherein the exposed surface is 99% free of nonsuperconducting oxide particles.

9. The method of claim 1 or 5, wherein the exposed surface is 99.5% free of nonsuperconducting oxide particles.

10. The method of claim 1 or 5, wherein the exposed surface is 99.8% free of nonsuperconducting oxide particles.

* * * * *

UNITED STATES PATENT AND TRADEMARK OFFICE
CERTIFICATE OF CORRECTION

PATENT NO.    : 6,339,047 B1
DATED         : January 15, 2002
INVENTOR(S)   : Christopherson et al.

It is certified that error appears in the above-identified patent and that said Letters Patent is hereby corrected as shown below:

Title page,
Item [73], Assignee, please correct to read -- American Superconductor Corporation -- instead of "American Semiconductor Corporation".

Signed and Sealed this

Thirty-first Day of May, 2005

JON W. DUDAS
*Director of the United States Patent and Trademark Office*